United States Patent
Zhu

(10) Patent No.: US 7,385,861 B1
(45) Date of Patent: Jun. 10, 2008

(54) SYNCHRONIZATION CIRCUIT FOR DDR IO INTERFACE

(75) Inventor: Xiaojun Zhu, Milpitas, CA (US)

(73) Assignee: Ambarella, Inc., Santa Clara, CA (US)

( * ) Notice: Subject to any disclaimer, the term of this patent is extended or adjusted under 35 U.S.C. 154(b) by 0 days.

(21) Appl. No.: 11/465,514

(22) Filed: Aug. 18, 2006

(51) Int. Cl.
*G11C 7/00* (2006.01)

(52) U.S. Cl. ............... 365/194; 365/233.1; 365/233.11

(58) Field of Classification Search ........... 365/233, 365/193, 194
See application file for complete search history.

(56) References Cited

U.S. PATENT DOCUMENTS

| | | | |
|---|---|---|---|
| 5,920,516 A | * | 7/1999 | Gilliam et al. ............. 365/200 |
| 6,519,291 B1 | * | 2/2003 | Dagdeviren et al. ........ 375/260 |
| 7,216,050 B1 | * | 5/2007 | Bachman et al. ........... 702/108 |
| 2005/0018528 A1 | * | 1/2005 | Hellwig ...................... 365/233 |
| 2007/0058478 A1 | * | 3/2007 | Murayama .................. 365/233 |

* cited by examiner

*Primary Examiner*—Huan Hoang
*Assistant Examiner*—Anthan T Tran
(74) *Attorney, Agent, or Firm*—Christopher P. Maiorana, PC

(57) ABSTRACT

An apparatus comprising a first circuit and a second circuit. The first circuit may be configured to present a first strobe signal having an unknown phase in relation to a local clock signal when receiving data from a memory. The second circuit may be configured to synchronize the first strobe signal with the local clock signal by (i) generating one or more second strobe signals and (ii) inserting a predetermined cycle delay between the one or more second strobe signals and the local clock signal.

17 Claims, 14 Drawing Sheets

SYNCHRONIZATION CIRCUIT FOR DDR IO INTERFACE

FIELD OF THE INVENTION

The present invention relates to memories generally and, more particularly, to a method and/or architecture for implementing a synchronization circuit for a DDR IO interface.

BACKGROUND OF THE INVENTION

In a conventional double data rate (DDR) synchronous dynamic random access memory (SDRAM) to application specific integrated circuit (ASIC) interface, incoming data is accompanied with a strobe signal. The strobe signal has a fixed (but unknown) phase relation with a local clock. The strobe signal needs to be synchronized with the local clock for stable data transaction. The round trip delay is the time between the issue of a command to the arrival of data from the SDRAM. The round trip delay also needs to be known to determine when the real data starts.

Conventional systems implement an on-board delay line or an on-chip PLL to synchronize the strobe signal with the local clock. The round trip delay is calculated during the system setup. However, the round trip delay calculation becomes less reliable as data rates increase and as process, voltage and temperature (PVT) variations become significant compared with the clock cycle time.

SUMMARY OF THE INVENTION

The present invention concerns an apparatus comprising a first circuit and a second circuit. The first circuit may be configured to present a first strobe signal having an unknown phase in relation to a local clock signal when receiving data from a memory. The second circuit may be configured to synchronize the first strobe signal with the local clock signal by (i) generating one or more second strobe signals and (ii) inserting a predetermined cycle delay between the one or more second strobe signals and the local clock signal.

The objects, features and advantages of the present invention include providing a synchronization circuit for a DDR IO interface that may (i) allow for the implementation of a simple system design, (ii) allow components with large delay variations to be used and/or (iii) compensate for any process, voltage and temperature (PVT) variation in real time.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
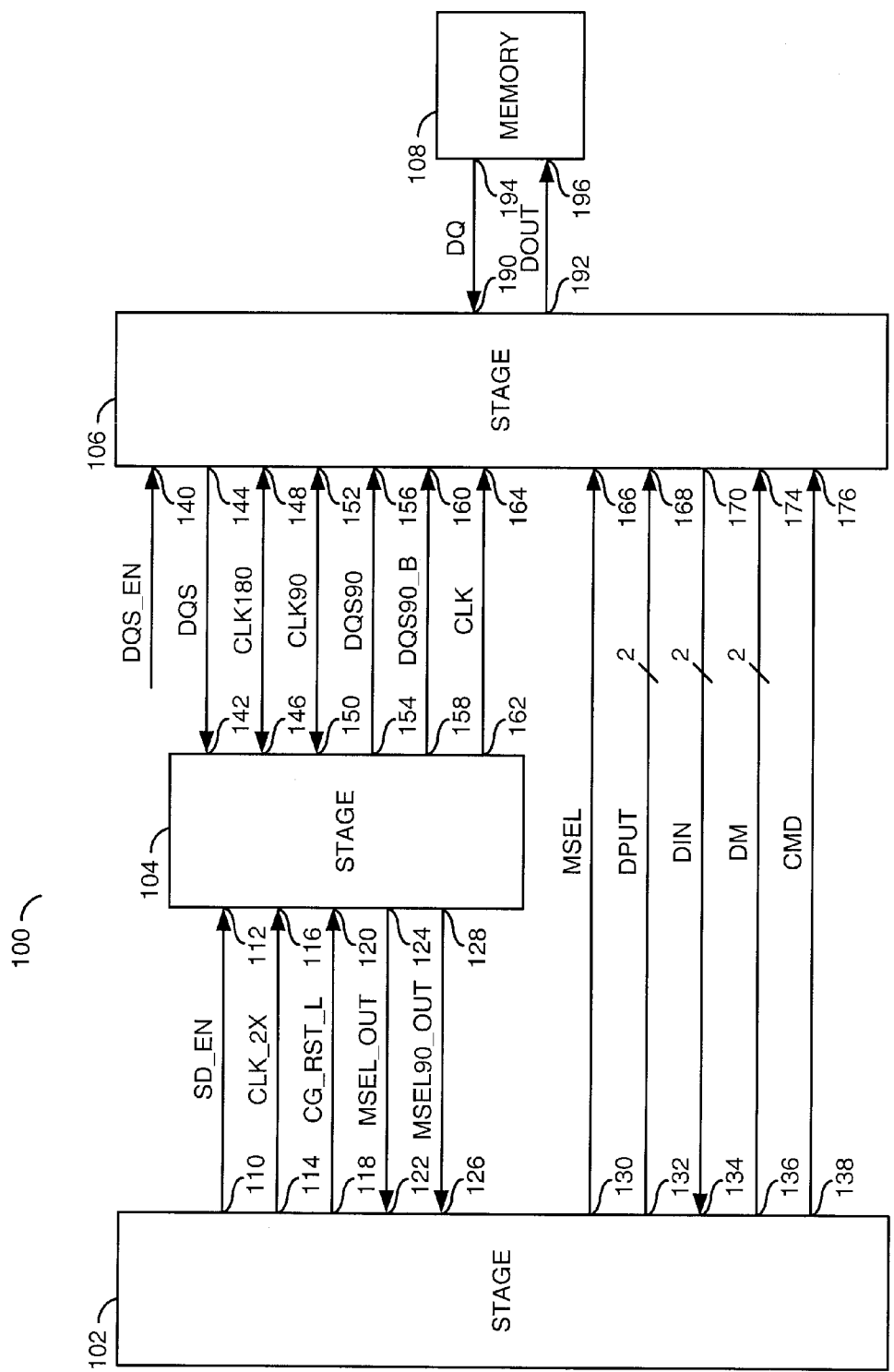
FIG. 1 is a block diagram of the present invention.

Referring to FIG. 1, a block diagram of a circuit 100 is shown in accordance with a preferred embodiment of the present invention. The circuit 100 may be implemented as a double data rate (DDR) input/output (IO) cluster. The circuit 100 generally comprises a stage (or circuit) 102, a stage (or circuit) 104, a stage (or circuit) 106 and a stage (or circuit) 108. The stage 102 may be implemented as a dynamic random access memory (DRAM) controller. The stage 106 may be implemented as a pad cluster. The stage 108 may be implemented as memory. The memory 108 may be implemented as a DDR SDRAM.

The DRAM controller 102 may have an output 110 that may present a signal (e.g., SD_EN), an output 114 that may present a clock signal (e.g., CLK_2X), an output 130 that may present a signal (e.g., MSEL), an output 132 that may present a signal (e.g., DPUT), an output 136 that may present a signal (e.g., DM), and an output 138 that may present a signal (e.g., CMD). The DRAM controller 102 may have an input 122 that may receive a signal (e.g., MSEL_OUT), an input 126 that may receive a signal (e.g., MSEL90_OUT) and an input 134 that may receive a signal (e.g., DIN).

The circuit 104 may have an input 112 that may receive the signal SD_EN, an input 116 that may receive the clock signal CLK_2X, an input 120 that may receive the signal CG_RST_L, an input 142 that may receive a first data strobe signal (e.g., DQS), an input/output 146 that may present/receive a clock signal (e.g., CLK180) and an input/output 150 that may present/receive a clock signal (e.g., CLK90). The circuit 104 may have an output 124 that may present the signal MSEL_OUT, an output 128 that may present the signal MSEL90_OUT, an output 154 that may present a signal (e.g., DQS90), an output 158 that may present a signal (e.g., DQS90_b), and an output 162 that may present a local clock signal (e.g., CLK).

The pad cluster 106 may have an input 140 that may receive a signal (e.g., DQS_EN), an input 156 that may receive the signal DQS90, an input 160 that may receive the signal DQS90_b, an input 164 that may receive the signal CLK, an input 166 that may receive the signal MSEL, an input 168 that may receive the signal DPUT, an input 174 that may receive the signal DM, an input 176 that may receive the signal CMD and an input 190 that may receive a signal (e.g., DQ). The pad cluster 106 may have an output 144 that may present the signal DQS, an output 170 that may present the data signal DIN and an output 192 that may present the signal DOUT. The pad cluster 106 may have an input/output 144 that may present/receive the signal CLK180 and an input/output 148 that may present/receive the signal CLK90. The memory 108 may have an input 196 that may receive the signal DOUT and an output 194 that may present the signal DQ.

The signal CLK may be implemented as a local clock signal. The signal CLK may be in phase with a core clock of the memory 108. The signal CLK may be locally generated by the stage 102. The signal CLK90 may be a delayed version of the signal CLK. The signal CLK90 may be delayed 90 degrees from the signal CLK. The signal CLK 180 may be an inverted signal CLK. The signal DQS90 may be delayed 90 degrees from the signal DQS. The signal DQS90 may be delayed by a predetermined cycle delay from the signal CLK. The signal DQS90_b may be an inverted signal DQS90.

The pad cluster 106 may include a number of IO pads for a DDRII interface. Each IO pad may include associated mixed signal blocks and pad edge logic. In one example, the circuit 100 may be implemented to support a high speed double data rate applications (e.g., in the range of 243 MHz or more). At such a speed, the circuit 100 may need tight timing control. Due to the large distance from the pad cluster 106 to the core (not shown), critical timing elements may be integrated into the pad cluster 106.

The memory 108 may present incoming data on the signal DQ when the circuit 100 is in a read mode. The pad circuit 106 may present the signal DQS in response to receiving incoming data from the memory 108. The phase relationship between the signal DQS and the signal CLK (e.g., the clock domain between the stages 104 and 106) may be unknown. To determine the phase relationship, the stage 104 may generate the signal DQS90 (or the second strobe signal). The signal DQS90 may be delayed by the predetermined cycle delay from the signal CLK. The pad circuit 106 may use the predetermined cycle delay between the signals DQS90 and CLK to synchronize the signal DQS to the correct clock domain. By synchronizing the signal DQS to the correct clock domain, the circuit 100 may provide for stable data transaction between the memory 108 and the stages 104 and 106.

The pad cluster 106 may control the sampling clock phase and provide a quarter clock cycle of setup and hold time when data is read. The circuit 100 may perform a calibration sequence every fixed number of reference cycles. By inserting a calibration sequence every fixed number of reference cycles, any real time PVT variation may be compensated on the fly.

The DRAM controller 102 may control the calibration sequence. During power up and SDRAM refresh cycles, two kinds of calibration may be executed. In a first calibration, the DRAM controller 102 may generate the signal MSEL in response to the signals MSEL_OUT and MSEL90_OUT. The signal MSEL may be used by the pad cluster 106 to determine whether to push data or pull data in over the signal DQ from the memory 108. The first calibration sequence will be discussed in more detail in connection with FIGS. 3-6 and in connection with Tables 1-2.

In a second calibration, the DRAM controller 102 may perform a round trip delay calculation. In the second calibration, the DRAM controller 102 may write a fixed pattern to the memory 108 over the signals DPUT and DOUT. The DRAM controller 102 may then issue a read command to the memory 108. The DRAM controller 102 may calculate the round trip delay by comparing the data read back from the memory 108 against the fixed pattern of data.

Figure 2:
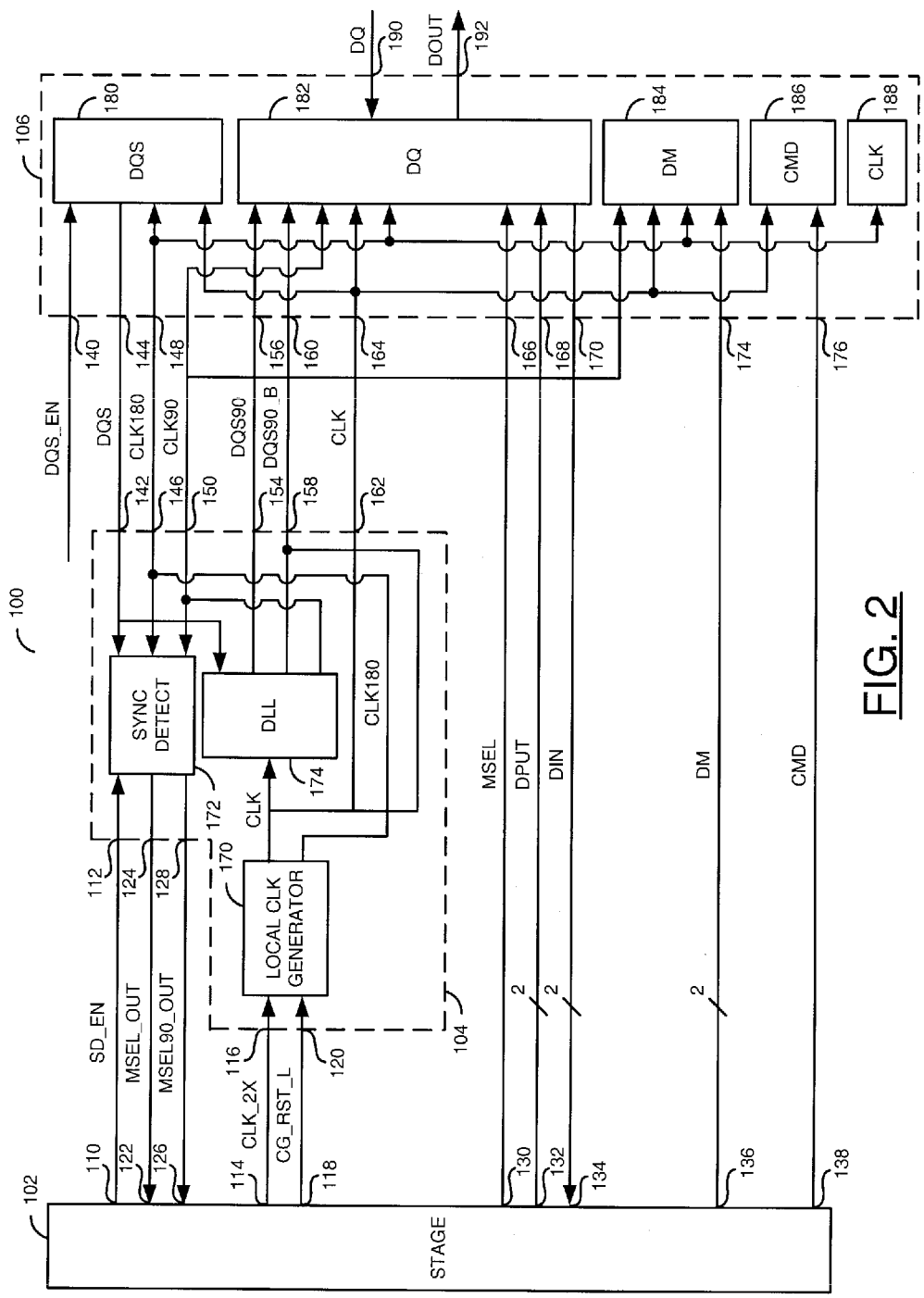
FIG. 2 is a more detailed diagram of the present invention.

Referring to FIG. 2, a more detailed block diagram of the circuit 100 is shown. The stage 104 generally comprises a block (or circuit) 170, a block (or circuit) 172, and a block (or circuit) 174. The circuit 170 may be implemented as a local clock generator. The circuit 172 may be implemented as a synchronization detection circuit. The circuit 174 may be implemented as a delay locked loop (DLL) circuit.

The pad cluster 104 (or pad cluster) generally comprises a block (or circuit) 180, a block (or circuit) 182, a block (or circuit) 184, a block (or circuit) 186 and a block (or circuit) 188. The circuit 180 may be implemented as a data strobe (or DQS) pad circuit. The circuit 182 may be implemented as a data (or DQ) pad circuit. The circuit 184 may be implemented as a data mask (or DM) pad circuit. The circuit 186 may be implemented as a command and address (or CMD) pad circuit. The circuit 188 may be implemented as a clock (or CLK) pad circuit.

In general, the circuit 100 may be implemented as a DDRII IO interface. The circuit 100 may be implemented to support a memory of all speed grades. The circuit 100 may (i) support both serial and parallel termination in a point to point configuration, (ii) allow for a serial/parallel hybrid configuration for power saving, (iii) detect the phase relation between the signal DQS and the signal CLK, (iv) program the synchronizer detection circuit 172 dynamically, (v) provide optional On-die Termination (ODT) with 150 Ohms or 75 Ohms effective impedance, and (vi) provide a controlled driver output impedance. The circuit 100 may be implemented such that the pad cluster 106 is independent of dedicated registers. A number of control signals may be presented internally within each pad circuit of the pad cluster 106 and the DRAM controller 102.

The DQ pad circuit 182 (or data pad circuit) may be used for reading and writing input and output data at a double data rate. The DQ pad circuit 180 may include edge logic. The edge logic may provide for accurate timing control. In one example, the DQ pad circuit 182 may include 16 pads (not shown). The particular number of pads included in the DQ pad circuit 182 may be varied to meet the design criteria of a particular implementation.

The DQS pad circuit 180 may be implemented as a number of differential IO pads which each include edge logic. The DQS pad circuit 180 may include edge logic that (i) receives the data strobe signal (or the signal DQS), (ii) performs DQS waveform generation and (iii) writes the signal DQS. In one example, the DQS pad circuit 180 may include two pad pairs which may be built based on the clock pad circuit 188. The particular number of pads included in the DQS pad circuit 180 may be varied to meet the design criteria of a particular implementation.

The DM pad circuit 184 may present data at a double data rate. In one example, the DM pad circuit 189 may include four pads. The DM pad circuit 189 may be built based on the DQ pad circuit 182. The pad logic of the DM pad circuit 189 may be similar to the pad logic of the DQ pad circuit 182. The clock pad circuit 188 may be a differential pad pair. The clock pad circuit 188 may transmit the signal CLK180 to the memory 108.

The CMD pad circuit 186 may transfer commands and/or addresses at a single data rate. The CMD pad circuit 186 may not need to meet strict timing standards. In one example, the DQS pad circuit 180 may include 21 pads. However, the particular number of pads included in the CMD pad circuit 186 may be varied to meet the design criteria of a particular implementation.

The DLL circuit 174 may be implemented as a hard macro IP. The DLL circuit 174 may generate the predetermined cycle delay for the signals DQS90 and DQS90_b. In one example, the DLL circuit 174 may generate a quarter cycle delay for the signals DQS90 and DQS90_b. The synchronization detection circuit 172 may use the signals DQS and DQS90_b to provide local clock synchronization detection for the circuit 100. The local clock generator 170 may generate the signal CLK. In one example, the local clock generator 170 may generate the signal CLK which includes a dual phase clock with a 50% duty cycle from the signal CLK_2X.

Each pad circuit within the pad cluster 106 may be instantiated multiple times to form a data bus in bytes. In general, the pad cluster 104 may not be shared with other clusters. In one example, the maximum round trip delay of the circuit 100 may be 3 times the clock cycle time. In one example, the minimum round trip delay may be less than 1 clock cycle time. Each pad circuit in the pad cluster 106 may have internal signals (e.g., OEN), a signal (e.g., PON) and a signal (e.g., TSEL) and a signal (e.g., IS). The signal OEN may be used to enable transceivers (not shown) in each pad circuit. The signal TSEL may be used to select the ODT for a transceiver. The signal IS may be used to select the ODT impedance control. In one example, if the signal IS is set to 0, an impedance of 75 Ohm may be selected. If the signal IS is set to 1, an impedance of 150 Ohms may be selected. The signals OEN, PON, TSEL and IS may be generated by the DRAM controller.

In operation, the DQS pad circuit 180 may present the signal DQS to the synchronization detection circuit 172 and the DLL circuit 174. The signal DQS may be equal to the core voltage level of the memory 106. The DLL circuit 174 may (i) delay the signal DQS and (ii) generate the signals DQS90 and DQS90_b. The DLL circuit 174 may present delayed versions (e.g., the signal DQS90 and DQS90_b) to the DQ pad circuit 182. The signal DQS90_B may be an inverted signal DQS90. The DLL circuit 174 may delay the signal DQS90 from the signal CLK by the predetermined cycle delay. In one example, the predetermined cycle delay may be a quarter cycle. The predetermined cycle delay may be varied to meet the design criteria of a particular implementation. The DQ pad circuit 182 may latch incoming data with the signals DQS90 and DQS90_b. After data is latched with the signals DQS90 and DQS90_b, the DQ pad circuit 182 may sample incoming data with the signal CLK and the signal CLK180.

Figure 3:
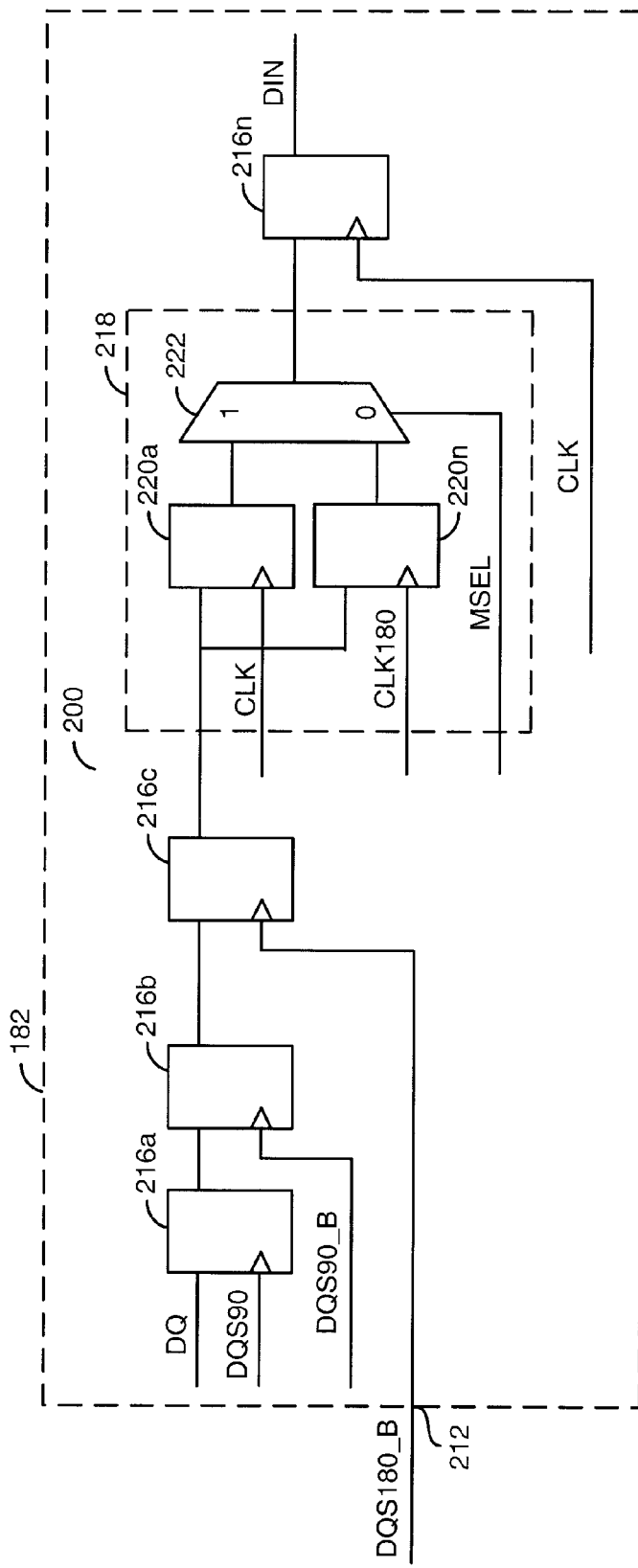
FIG. 3 is a diagram illustrating a DQS/CLK synchronization circuit.

Referring to FIG. 3, a diagram illustrating a DQS/CLK synchronization circuit 200 is shown. The DQS/CLK synchronization circuit 200 may be implemented as part of the DQ pad circuit 182. The circuit 210 may have an input 212 that may receive a signal (e.g., DQS180_B). The signal DQS180_B may be an inverted signal DQS delayed by 180 degrees. The circuit 200 generally comprises a number of blocks (or circuits) 216a-216n and a block (or circuit) 218. The number of blocks (or circuits) 216a-216n may be implemented as flip-flops. The circuit 218 may be implemented as a multiplexer circuit. The multiplexer circuit 218 generally comprises flip-flops 220a-220n and a multiplexer 222.

In general, incoming data on the signal DQ may be latched to the DQ pad circuit 182. The incoming data may be presented by the memory 108. The data may need to be flopped to the local clock domain (e.g., the clock domain as defined by the signal CLK) before the data is presented to the DRAM controller 102 via the signal DIN. Due to the large round trip delay from a host processor (not shown) to the memory 108, the phase relation between the signal DQS and the local clock (the signal CLK) may be arbitrary. In order to avoid meta-stability and make the data transfer deterministic, the DQS/CLK synchronization circuit 200 may implement a synchronization mechanism. The DQS/CLK synchronization circuit 200 may synchronize the signal DQS (e.g., via the signals DQS and DQS90_B) to the signal CLK.

The flip-flop 216a may latch the data on the signal DQ with the rising edge of the signal DQS90. The output of the flip-flop 216a may be sampled with the falling edge of the signal DQS90_B. The output of the flip-flop 216b may be sampled with the rising edge of the signal DQS180_B. The flip-flops 220a-220n may sample the output of the flip-flop 216c using the signal CLK and the signal CLK180. The outputs of the flip-flops 220a-220n may be multiplexed together with the multiplexer 222. The signal MSEL may select between the output of the flip-flop 220a and the output of the flip-flop 220n. The signal MSEL may be generated by the DRAM controller 102 (which will be discussed in more detail in connection with FIG. 5). The DQS/CLK synchronization circuit 200 may ensure that there is at least quarter cycle of separation between the rising edge of the signal DQS90_b and the next sampling clock. The flip-flop 216n may sample the output of the multiplexer 222 using the signal CLK.

Figure 4:
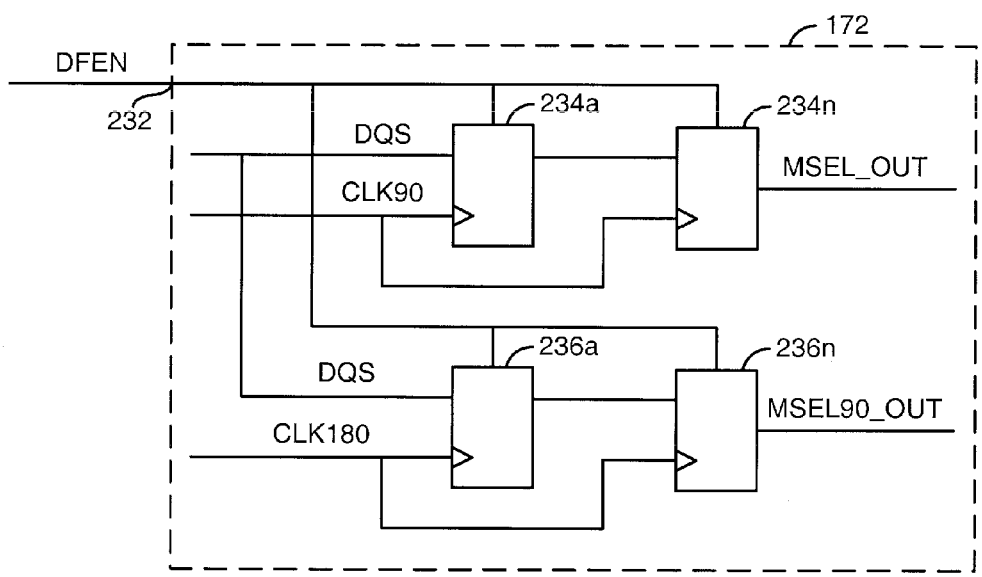
FIG. 4 is a diagram illustrating a multiplexer select generation circuit.

Referring to FIG. 4, a more detailed diagram illustrating the synchronization detection circuit 172 is shown. The circuit 172 may have an input 232 that may receive a signal (e.g., DFEN). The signal DFEN may be generated by the DRAM controller 102. The signal DFEN may enable the synchronization detection circuit 172. The synchronization detection circuit 172 generally comprises a number of blocks (or circuits) 234a-234n and a number of blocks (or circuits) 236a-236n. The circuits 234a-234n may be implemented as flip-flops. The circuits 236a-236n may be implemented as flip-flops.

The signal MSEL90_OUT may be used to determine the data pull-in/push-out together with the signal MSEL_OUT. The signals MSEL_OUT and MSEL90_OUT may be sent to the DRAM controller 102. The flip-flops 234a-234n and the flip-flops 236a-236n may be enabled during sampling. The DRAM controller 102 may need to process the signal MSEL_OUT and MSEL90_OUT. The DRAM controller 102 may sample the signal MSEL_OUT and MSEL90_OUT during the first calibration process to determine the appropriate signal MSEL to send to the multiplexer circuit 218 as shown in connection with FIG. 3. The signals MSEL_OUT and MSEL90_OUT may be valid only during the first calibration process. The signal MSEL that is sent form the DRAM controller 102 to the multiplexer circuit 218 may not change until the next calibration cycle is performed. The state of the signal MSEL may be one or more calibration sequences behind the current state of the signals MSEL_OUT and MSEL90_OUT.

For the DRAM controller 102 to program the signal MSEL, there must be valid toggling of the signal DQS. The circuit 100 may achieve valid signal DQS toggling by issuing a set of read commands. The signal DFEN may not be active until N cycles later, where N>=Column Address Strobe (CAS)+5, the 5 cycles include round trip delay, and two cycles for the signal MSEL_OUT to be presented out of the synchronization detection circuit 172. The training of the signal DQS may be at least 8 cycles long (e.g., four back to back reads with a burst length of 4). The synchronization detection circuit 172 may present the signals MSEL_OUT and MSEL90_OUT to the DRAM controller 102. The DRAM controller 102 may decide when and what value to send to the DQS/CLK synchronization circuit 200 over the signal MSEL.

In the unlikely scenario where the rising edge of the signal CLK may overlap with either the rising edge or falling edge of the signal DQS, the sampled value of the signal MSEL_OUT and the signal MSEL90_OUT may be 1 or 0.

Figure 5:
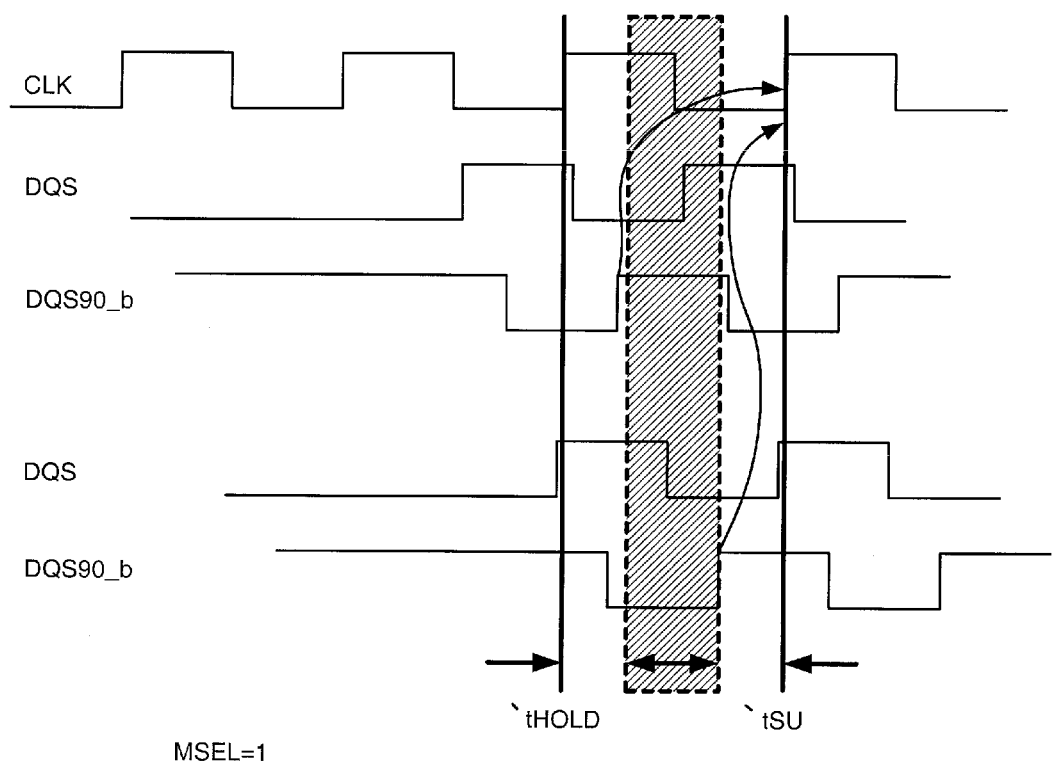
FIG. 5 is a timing diagram illustrating synchronization timing in a first state.
Figure 6:
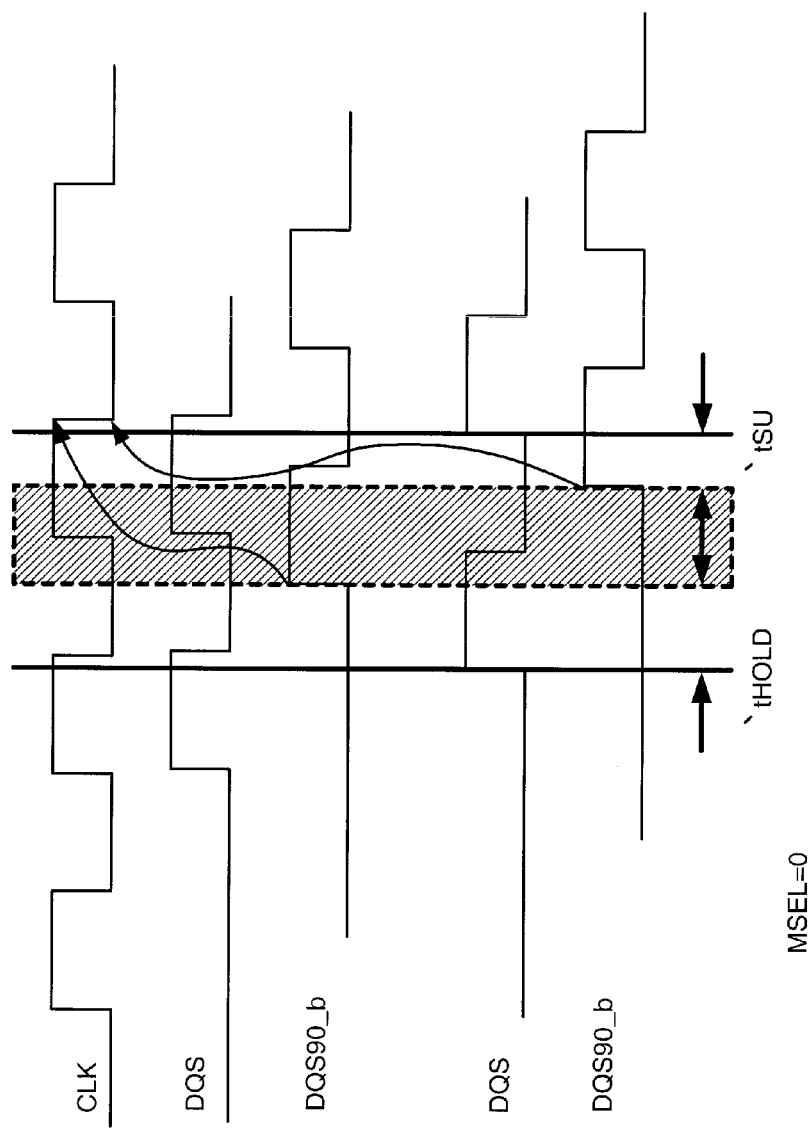
FIG. 6 is a timing diagram illustrating synchronization timing in a second state.

FIG. 5 illustrates a timing diagram for synchronization timing when the signal MSEL is equal to one. FIG. 6 illustrates a timing diagram for synchronization timing when the signal MSEL is equal to zero. In general, the minimum setup and hold time between the signals DQS90_b, CLK and/or CLK180 may be a quarter cycle delay. The maximum setup and hold time between the signals DQS90_b, CLK and CLK180 may be ½ tCK.

The phase relation between the signals DQS, CLK and CLK180 may be a function of PVT. The phase relation between the signal DQS, CLK and CLK180 may change if the voltage or temperature changes.

The following TABLES 1-2 illustrate previous and current states of the signals MSEL_OUT and MSEL90_OUT:

TABLE 1

| Previous | | Current | | | |
| --- | --- | --- | --- | --- | --- |
| MSEL_OUT | MSEL90_OUT | MSEL_OUT | MSEL90_OUT | Early/Late | Comments |
| 0 | 0 | 0 | 0 | No change | |
| 0 | 0 | 0 | 1 | No change | DQS faster |
| 0 | 0 | 1 | 0 | Push out 1 tCK | DQS slower |
| 0 | 0 | 1 | 1 | Error | Delay changed by more ¼ cycle |
| 0 | 1 | 0 | 0 | No change | DQS slower |
| 0 | 1 | 0 | 1 | No change | |
| 0 | 1 | 1 | 0 | Error | Delay changed by more ¼ cycle |
| 0 | 1 | 1 | 1 | No change | DQS faster |
| 1 | 0 | 0 | 0 | Pull in 1 tCK | DQS faster |

TABLE 2

| Previous | | Current | | | |
| --- | --- | --- | --- | --- | --- |
| MSEL_OUT | MSEL90_OUT | MSEL$_{13}$OUT | MSEL90_OUT | Early/Late | Comments |
| 1 | 0 | 0 | 1 | Error | Delay changed by more ¼ cycle |
| 1 | 0 | 1 | 0 | No change | |
| 1 | 0 | 1 | 1 | No change | DQS slower |
| 1 | 1 | 0 | 0 | Error | Delay changed by more ¼ cycle |
| 1 | 1 | 0 | 1 | No change | DQS faster |
| 1 | 1 | 1 | 0 | No change | DQS slower |
| 1 | 1 | 1 | 1 | No change | |

When the signal MSEL_OUT toggles from a previous value, the data (on the signal DIN) that was presented from the DQ pad circuit 182 may be one cycle earlier or one cycle later than the previous value of the signal MSEL_OUT. In such a case, the status of the signal MSEL (or the second sampling output) may help to identify such a scenario.

When both of the signals MSEL_OUT and MSEL90_OUT change values, such a condition may indicate that the signal DQS has more than a ¼ clock cycle time delay shift. Such a delay shift increase may indicate that the synchronization detection circuit 172 is sampled too slowly, or that there may be a large noise spike in the circuit 100.

If the signals MSEL_OUT and MSEL90_OUT changes value from (0,0) to (1,0), the data on the signal DIN to the DRAM controller 102 may be one cycle late. The DRAM controller 102 may be adjusted accordingly in response to such a relationship.

If the signals MSEL_OUT and MSEL90_OUT changes value from (1,0) to (0,0), the data on the signal DIN to the DRAM controller 102 may be one cycle earlier than the previous operation. The DRAM controller 102 may pull in the data by one cycle. In general, dedicated cycles may not be needed in order to refresh the signal MSEL. The signal MSEL may be refreshed during a normal back-to back READ operation.

While the signals MSEL_OUT and MSEL90_OUT are generated locally by the synchronization detection circuit 172, the signal MSEL_OUT may not be used by the DQ pad circuit 182 (or the DQS/CLK synchronization circuit 200). The synchronization detection circuit 172 may send the signals MSEL_OUT and MSEL90_OUT to the DRAM controller 102. The DRAM controller 102 may generate and present the signal MSEL to the DQ pad circuit 182 (or the DQS/CLK synchronization circuit 200) as a different value than the current value of the signal MSEL_OUT. By sending the signal MSEL to the DQ pad circuit 182 via the DRAM controller 102, the signal MSEL_OUT may not change the value of the signal MSEL in the middle of operation. If the DRAM controller 102 presents the contents of the signal MSEL_OUT directly on the signal MSEL, a synchronization error may be created. With the current implementation, if the signal MSEL_OUT changes, the DRAM controller 102 may hold the value of the signal MSEL_OUT until the current read operation is performed. Depending on the value of the signal MSEL_OUT, the DRAM controller 102 may determine whether to push-out or pull-in data coming from the DQ pad circuit 182. Such a determination may be possible because (i) the large setup/hold time margin between the signals DQS and CLK and (ii) the delay of the signal DQS changes slowly. Since the DRAM controller 102 presents the signal MSEL, the DQS/CLK synchronization circuit 200 may function even if the synchronization detection circuit 172 generates the signal MSEL_OUT at a value different from the value of the signal MSEL.

The signal MSEL_OUT may not be used directly in order to avoid the possibility of oscillation. If the signal DQS is close to being edge aligned with the signal CLK, any noise or clock jitter may swing the value of the signal MSEL_OUT. Such a jitter may cause the DQS/CLK synchronization circuit 200 to move back and forth and interfere with the normal operation. If the signal MSEL_OUT is sampled periodically with a large enough interval, then such an oscillation may not impact performance. In general, an auto-refresh rate of 7.8 us per interval may be fast enough for performing dynamic synchronization.

The implementation of the DQS/CLK synchronization circuit 200 may guarantee that the incoming data on the signal DQ may be correctly latched if the data is valid. The DQS/CLK synchronization circuit 200 may not be able to determine how many clock cycles the round trip delay may use. The DRAM controller 102 may need to know the round trip delay to ensure that incorrect data is not read or valid data is not missed.

If the DQS/CLK synchronization circuit 200 is programmed properly, the circuit 100 may calculate the round trip delay (or perform the second calibration) by performing the following steps:

In a first step, the pad cluster 106 may write a unique data sequence of words to the memory 108 via the signals DPUT and DOUT. By providing a unique data sequence, the data sequence may be easily distinguishable.

In a second step, the DRAM controller 102 may issue a READ command, incoming data may be read from the pad cluster 106 after N cycles, where N=N_CAS+Nmax, and Nmax may be a maximum round trip delay as a multiple of the clock cycle time.

In a third step, the circuit 100 may check the unique data sequence of words that are read back and compare to the unique data sequence of expected words. Such a check and comparison may provide the round trip delay. Once the delay is found, the circuit 100 may write the round trip delay to a register (not shown).

In a fourth step, if there is a change in the signal MSEL such that data push-out or pull-in occurs, the register may be increased or decreased by 1.

Figure 7:
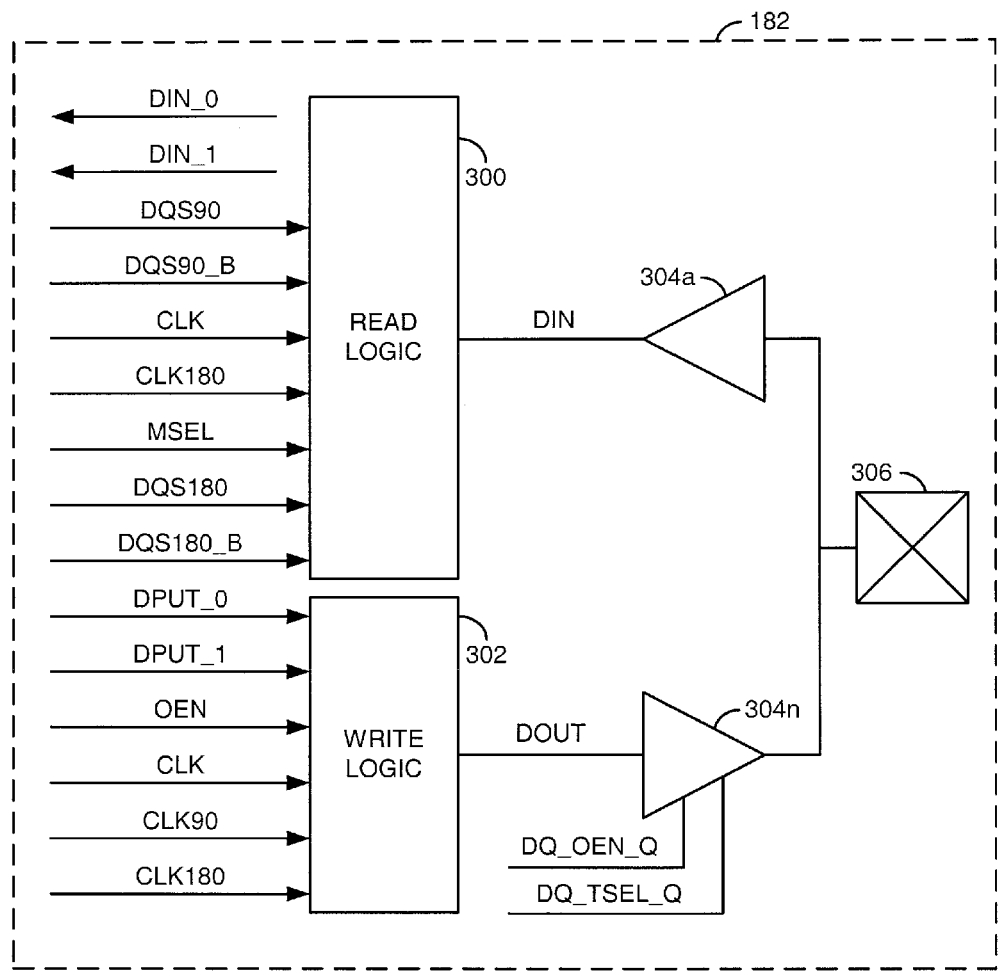
FIG. 7 is a diagram illustrating a DQ pad with edge logic.

Referring to FIG. 7, a more detailed diagram illustrating a DQ pad circuit 182 with edge logic is shown. The DQ pad circuit 182 generally comprises a block (or circuit) 300, a block (or circuit) 302, a number of blocks (or circuits) 304a-304n and a block (or circuit) 306. The circuit 300 may be implemented as a read logic circuit. The circuit 302 may be implemented as a write logic circuit. The number of circuits 304a-304n may be implemented as transceivers. The circuit 306 may be implemented as a pad. The signal DIN may be separated into a signal (e.g., DIN_0) and a signal (e.g., DIN_1). The signal DQS90 may be delayed by 90 degrees to generate a signal (e.g., DQS180). A signal DQS180_B may be the inverse of the signal DQS180. The DRAM controller 102 may generate internal pad signals (e.g., DQ_OEN_Q and DQ_TSEL_Q). The internal pad signals may be flopped with the local clock signal CLK.

Figure 8:
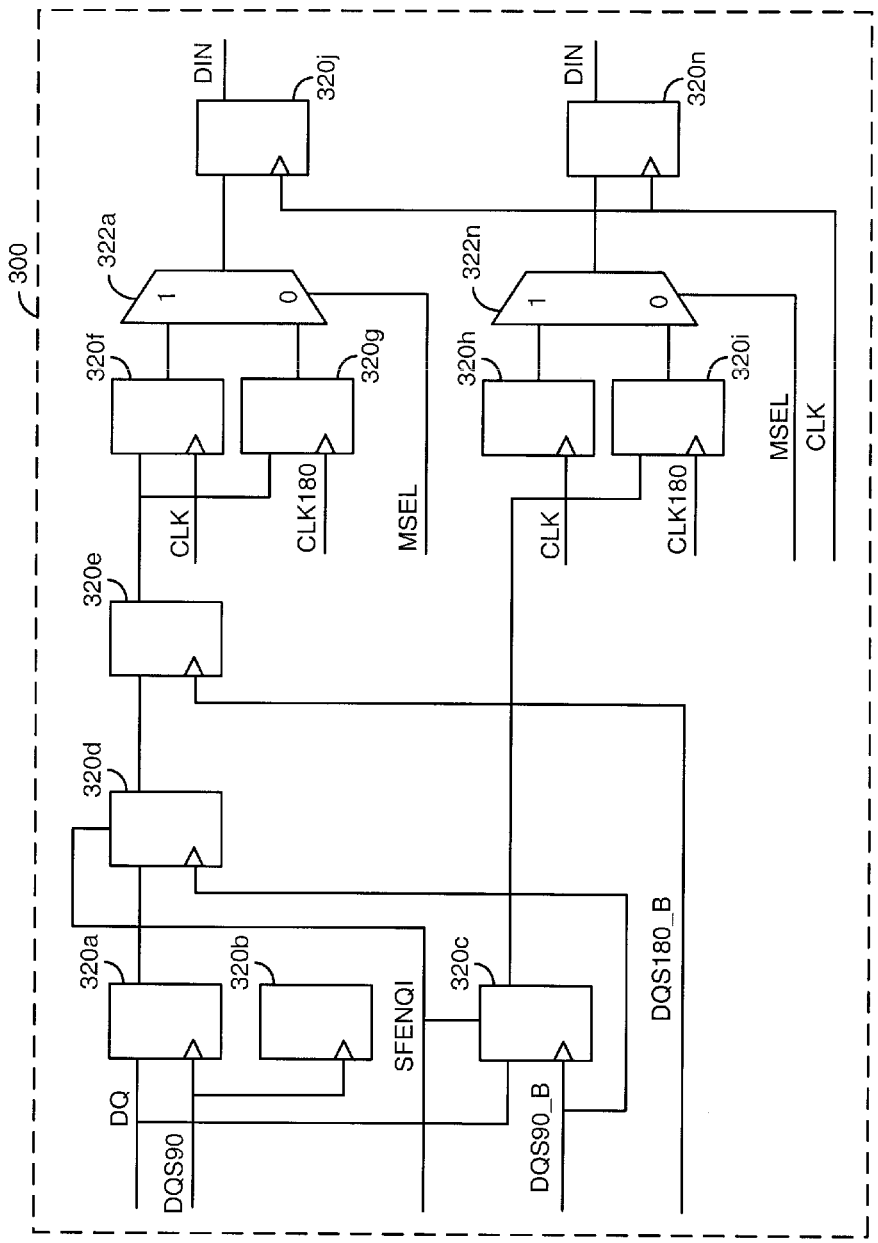
FIG. 8 is a diagram illustrating a DQ pad with READ logic

Referring to FIG. 8, a diagram illustrating a DQ read logic circuit 300 is shown. The DQ read logic circuit 300 may be implemented as part of the data pad circuit 182. The DQ read logic circuit 300 generally comprises a number of blocks (or circuits) 320a-320n and a number of blocks (or circuits) 322a-322n. The number of circuits 320a-320n may be implemented as flip-flops. The number of circuits 322a-322n may be implemented as multiplexers. The DQ read logic circuit 300 may be a multi-bit implementation of the DQS/CLK synchronization circuit 200. In general, the signal DQS90 may be presented to the flip-flop 320b to provide for input capacitance matching.

Figure 9:
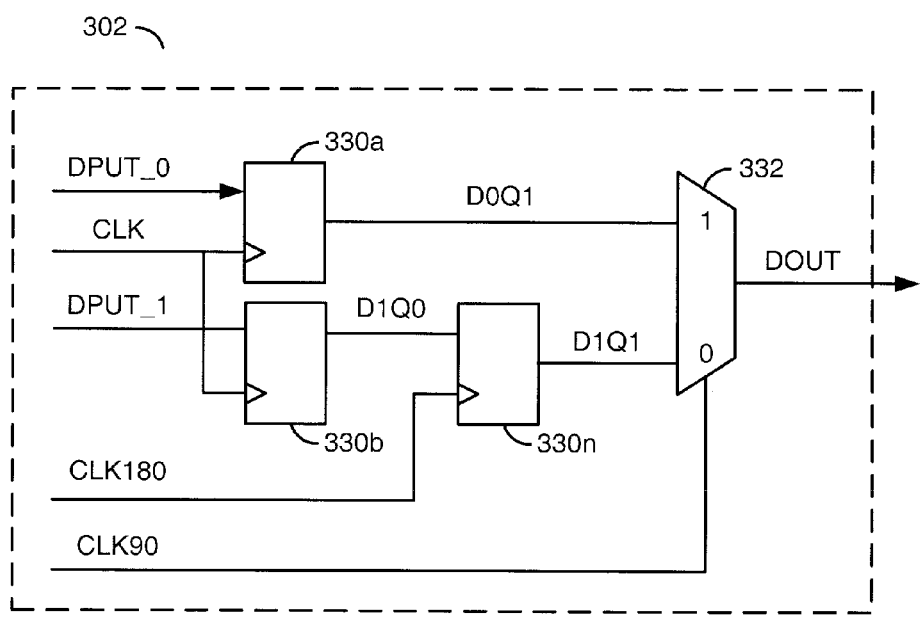
FIG. 9 is a diagram illustrating a DQ pad WRITE logic.

Referring to FIG. 9, a diagram illustrating a DQ write logic circuit 302 is shown. The DQ write logic circuit 302 may be implemented as part of the data pad circuit 182. The DQ write logic circuit 302 generally comprises a number of blocks (or circuits) 330a-300n and a block (or circuit) 332. The number of blocks (or circuits) 330a-330n may be implemented as flip-flops. The circuit 332 may be implemented as a multiplexer. The signal DPUT may be separated into a signal (e.g., DPUT_0) and a signal (e.g., DPUT_1).

Data on the signals DPUT_0 and DPUT_1 may be latched by the flip-flops 330a-330b. The signals DPUT_0 and DPUT_1 may be latched at a clock rate defined by the signal CLK. The flip-flop 330a may have an output that may present a signal (e.g., D0Q0) in response to the signals DPUT_0 and CLK. The flip-flop 330b may have an output that may present a signal (e.g., D1Q0) in response to the signals DPUT_1 and CLK. The flip-flop 330n may latch the signal D1Q0 at a clock rate defined by the signal CLK180. The flip-flop 330n may have an output that may present a signal (e.g., D1Q1) in response to the signals D1Q0 and CLK180. The multiplexer 332 may present data between the signals D0Q0 and D1Q1 on the signal DOUT. The multiplexer 332 may present data between the signals D0Q0 and D1Q1 based on the state of the signal CLK90.

Figure 10:
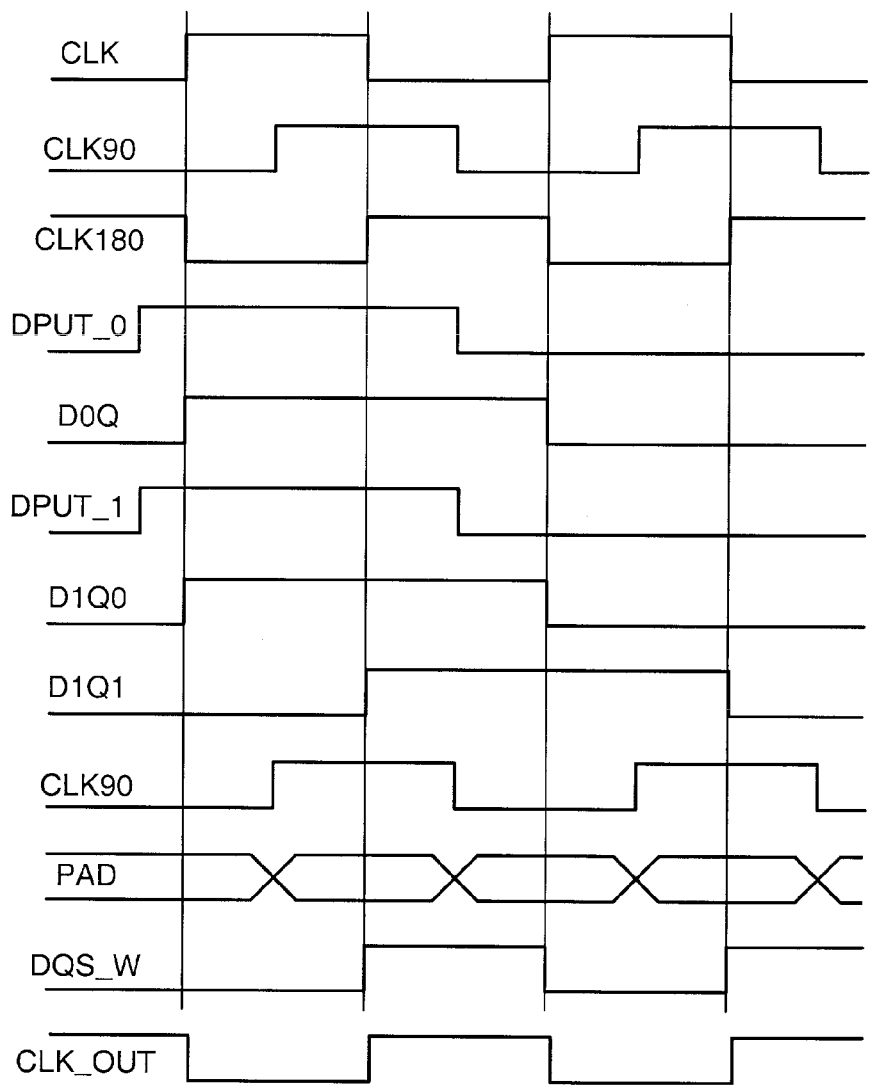
FIG. 10 is a timing diagram of a DQ pad WRITE waveform.

FIG. 10 generally illustrates a timing diagram of a DQ pad write waveform in accordance with the DQ write logic circuit 302.

Figure 11:
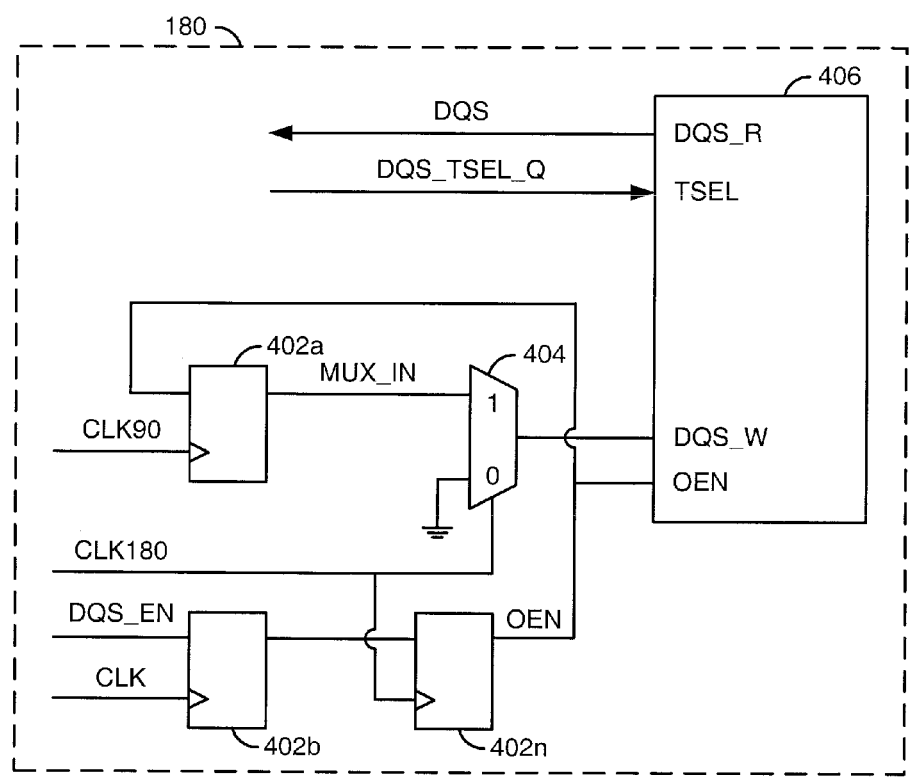
FIG. 11 is a diagram illustrating a DQS pad with edge logic.

Referring to FIG. 11, a diagram illustrating the DQS pad circuit 180 is shown. The DQS pad circuit 180 generally comprises a number of blocks (or circuits) 402, a block (or circuit) 404 and a block (or circuit) 406. The number of circuits 402a-402n may be implemented as flip-flops. The circuit 404 may be implemented as a multiplexer. The circuit 406 may be implemented as an I/O circuit. A DQS internal pad signal (e.g., DQS_TSEL_Q) may be generated from the DRAM controller 102 for the DQS pad circuit 180. A signal (e.g., DQS_W) and a signal (e.g., OEN) may be presented to the circuit 406.

In a write mode, the circuit 406 may generate the signal DQS. The signal DQS may be center aligned with output data on the signal DOUT. The signal DQS may satisfy pre-amble and post-amble timing criteria. The flip-flop 402b may latch the signal DQS_EN based on the signal CLK. An output of the flip-flop 402b may be latched by the flip-flop 402n based on the signal CLK180. The flip-flop 402a may generate the signal OEN. The flip-flop 402a may latch the signal OEN based on the signal CLK90. The flip-flop 402a may have an output that may present a signal (e.g., MUX_IN). The multiplexer 404 may present (i) data on the signal MUX_IN or (ii) a zero value on the signal DQS_W to an input of the circuit 406 in response to the state of the signal CLK180. In one example, the pre-amble of the signal DQS may be within the range of 0.9 and 1.1 the clock cycles. In one example, the post-amble of the signal DQS may be within the range of 0.4 tck and 0.6 tck. The length of the signal DQS_EN may be a burst length of +1 for the pre-amble.

The signal DQS_EN may control the input/output mode of the DQS pad circuit 180. If the signal DQS_EN is 0, the DQS pad circuit 180 may be in an output mode. In the output mode, the signal DQS may be written out to the memory 108. If the signal DQS_EN is 1, then the DQS pad circuit 180 may be in an input mode. In the input mode, the signal DQS may be presented from the memory 108. In such a case, a local generation of the signal DQS may not be needed. However, the phase of the signal DQS may need to be synchronized with the local clock of the circuit 100 in the input mode.

In the input mode (or read mode), the DQS pad circuit 180 may translate the signal DQS into a waveform at the core voltage level. External logic (e.g., the synchronization detection circuit 172 and the DLL circuit 174) may delay the signal DQS to generate the signals DQS90 and DQS90_b. The DLL circuit 174 may present the signals DQS90 and DQS90_b to the DQ pad circuit 182 to latch incoming data on the signal DQ.

The Joint Electron Device Engineering Council (JEDEC) has issued the DDR2 SDRAM specification JESD79-24, which may support either differential or single-ended mode transceivers. The memory 108 may be configured to support either differential or single-ended modes. Differential or single-ended transceivers may be supported for the host processor. The memory 108 may not support both differential and single-ended transceivers at any given time due to IO IP limitations. The present invention may adopt differential signaling to ensure a wider range of board selection. In general, differential DQS signaling may use two more pins than single-ended DQS signaling.

Figure 12:
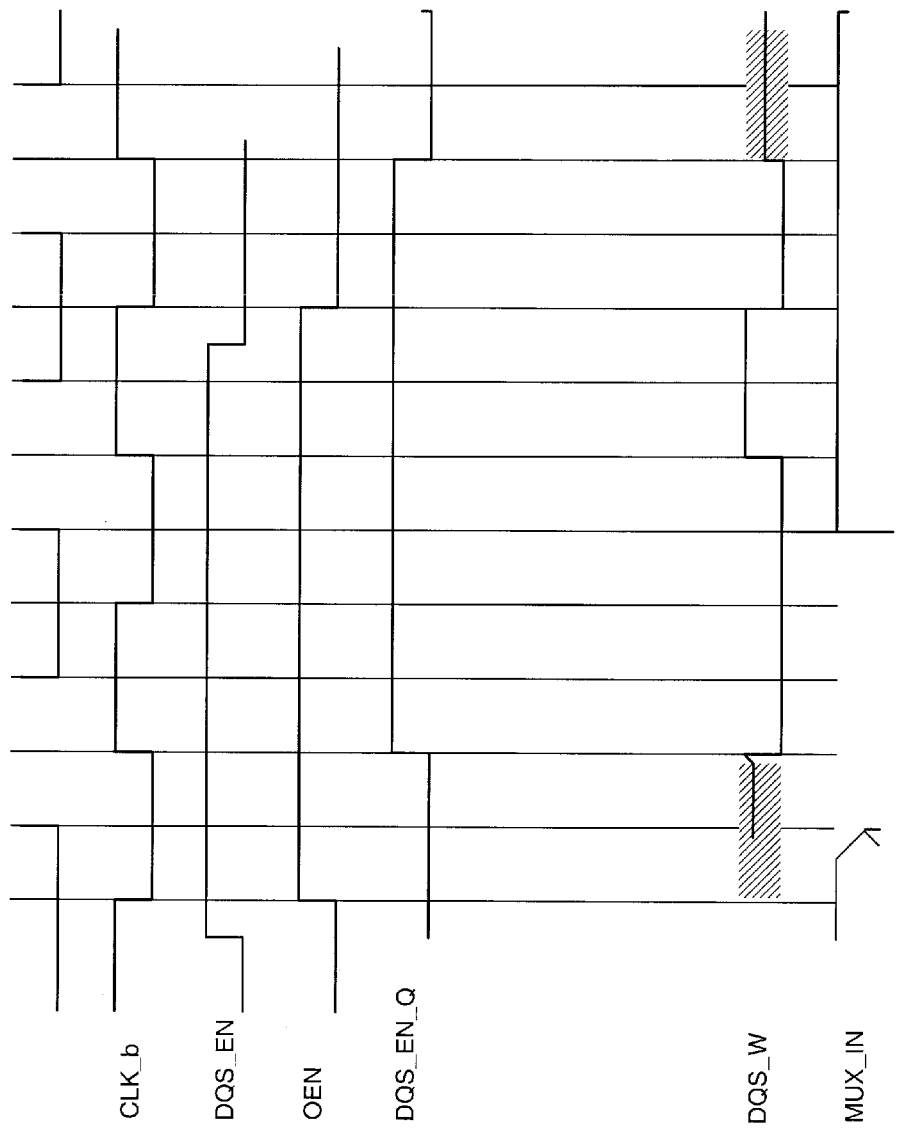
FIG. 12 is a timing diagram illustrating a DQS WRITE waveform.

Referring to FIG. 12, a timing diagram illustrating an ADDRESS/COMMAND PAD with edge logic is shown. The timing diagram may represent the write waveform of the signal DQS. The write waveform of the signal DQS may have a burst length of two. In one example, the burst length may be 4 or 8. The particular burst length of the write waveform of the signal DQS may be varied to meet the design criteria of a particular implementation. The rising edge of the signal CLK may be aligned with the signal CMD.

Figure 13:
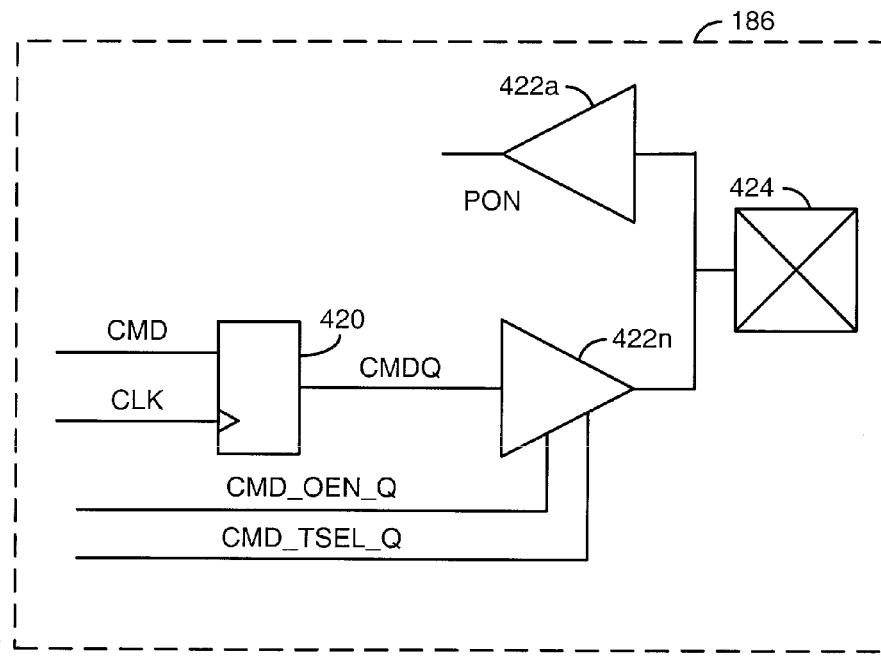
FIG. 13 is a diagram illustrating a COMMAND pad edge logic.

Referring to FIG. 13, a more detailed diagram of the command pad circuit 186 is shown. The command pad circuit 186 generally comprises a block (or circuit) 420, a number of blocks (or circuits) 422a-422n and a block (or circuit) 424. The circuit 420 may be implemented as a flip-flop. The number of circuits 422a-422n may be implemented as transceivers. The circuit 424 may be implemented as a pad.

A number of internal pad signals (e.g., CMD_TSEL_Q and CMD_OEN_Q) may be generated from the DRAM controller 102 for the command pad circuit 186. The flip-flop 420 may latch addresses or commands on the signal CMD based on the rising edge of the signal CLK. The signal CMD may include addresses and/or commands that may be generated from the DRAM controller. The flip-flop 420 may have an output that may present a signal (e.g., CMDQ). The transceiver 422n may have an input that may receive the signal CMDQ, an input that may receive the signal CMD_OEN_Q, and an input that may receive the signal CMD_TSEL_Q. The transceiver 422n may have an output that may present a signal to the transceiver 422a and the pad 424. The pad 424 may present addresses or commands to the memory 108.

Figure 14:
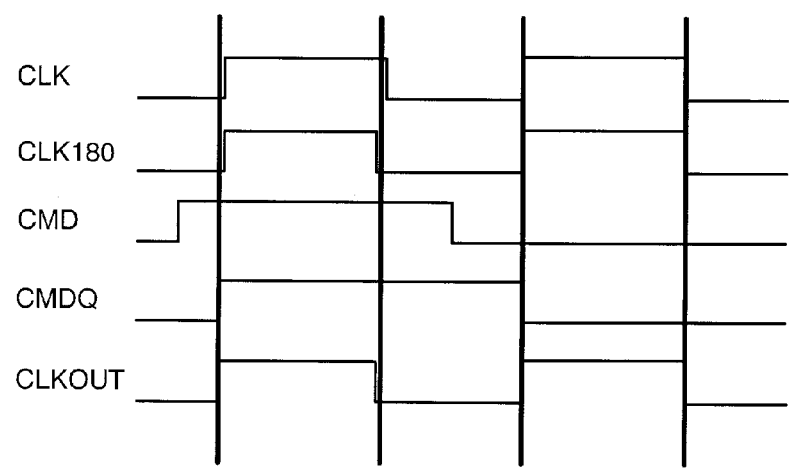
FIG. 14 is a timing diagram illustrating an ADDRESS/COMMAND pad with edge logic.

FIG. 14, generally illustrates a timing diagram of the ADDRESS/COMMAND pad circuit 186. The rising edge of the signal CLK_OUT may be center aligned with the data eye of the signal CMD. The signal CMDQ may be delayed by the signal CMD by a predetermined amount of time.

Figure 15:
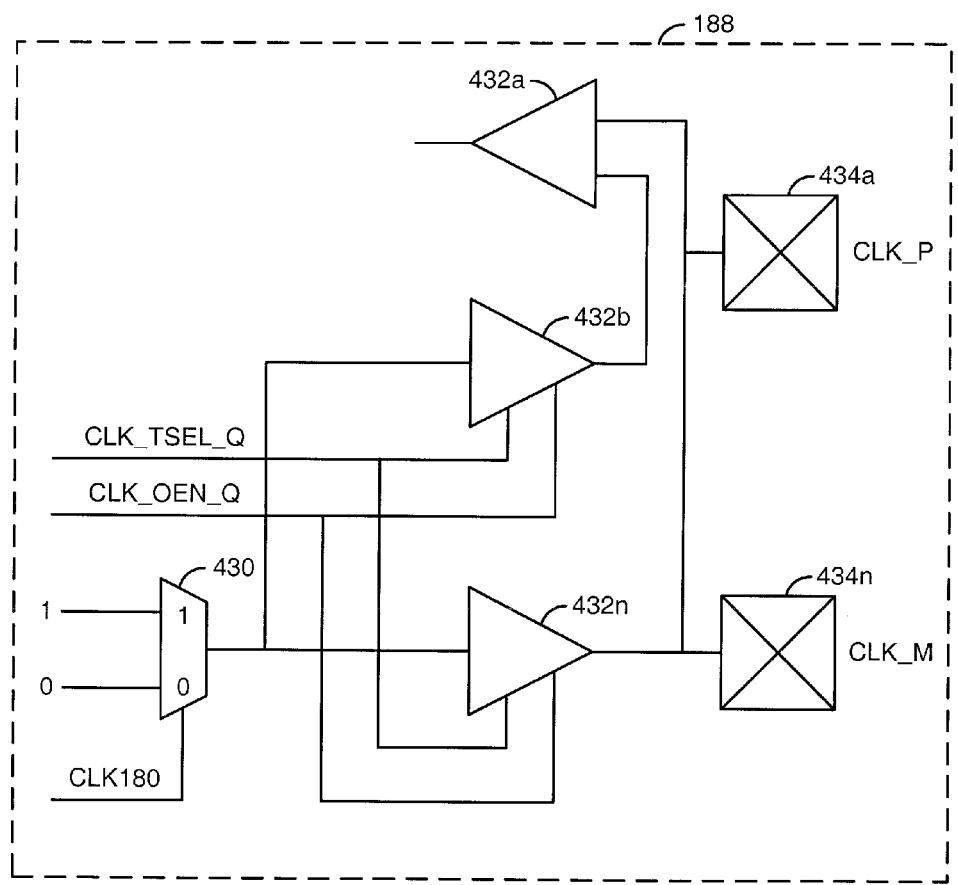
FIG. 15 is a diagram illustrating a clock output pad.

Referring to FIG. 15, a diagram illustrating the clock output pad 188 is shown. The clock output pad 188 may be implemented as differential output pad (e.g., two pad slots). The clock output pad 188 generally comprises a block (or circuit) 430, a number of blocks (or circuits) 432a-432n, and a number of blocks (or circuits) 434a-434n. The circuit 430 may be implemented as a multiplexer. The number of circuits 432a-432n may be implemented as transceiver. The number of circuits 434a-434n may be implemented as pads. The pad 434a may be implemented as a CLK_P pad. The pad 434n may be implemented as a CLK_M pad.

A number of internal pad signals (e.g., CLK_TSEL_Q and CLK_OEN_Q) may be generated from the DRAM controller 102. The signal CLK_TSEL_Q may be deasserted when the circuit 100 is in a normal mode. The multiplexer 430 may have an input that may receive 1 and an input that may receive 0. The multiplexer 430 may present 0 or 1 in response to the signal CLK180. The transceiver 432b and the transceiver 432n may have an input that may receive the signal CLK_TSEL_Q, an input that may receive the signal CLK_OEN_Q and an input that may receive the output of the multiplexer 430. The transceiver 432b may present the state of the multiplexer 430 to the transceiver 432a. The transceiver 432n may present the state of the multiplexer 430 to the pad 434a and the pad 434n. The pad 434a and the pad 434n may present the state of the multiplexer 430 to the memory 108. The clock output pad 188 may allow components with large delay variations to be used.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) to meet the design criteria of a particular implementation. Additionally, inverters may be added to change a particular polarity of the signals.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
    a first circuit configured to present a first strobe signal having an unknown phase in relation a local clock signal when receiving data from a memory;
    a second circuit configured to synchronize said first strobe signal with said local clock signal by (i) generating one or more second strobe signals and (ii) inserting a predetermined cycle delay between said one or more second strobe signals and said the local clock signal; and
    a memory controller configured to automatically calculate a round trip delay by (i) sending a sequence of data in a fixed pattern to the memory, (ii) issuing a read command to said memory to read data and (iii) determining the round trip delay by comparing the data read back against said data with said fixed pattern.

2. The apparatus according to claim 1, wherein said predetermined cycle delay is the phase relationship between said one or more second strobe signals and said local clock signal.

3. The apparatus according to claim 1, wherein said first circuit comprises a data strobe pad configured to set said first strobe signal equal to a voltage level of said memory.

4. The apparatus according to claim 1, wherein said second circuit comprises a delay locked loop circuit configured to generate said predetermined cycle delay.

5. The apparatus according to claim 1, wherein said first circuit comprises a data pad configured to present said data to said second circuit.

6. The apparatus according to claim 5, wherein said data pad comprises:
    a first flip-flop configured to latch said data based on said one or more second strobe signals;
    a second flip-flop configured to latch an output of said first flip-flop based on a first inverse of said one or more second strobe signals;
    a third flip-flop configured to latch an output of said second flip-flop based on one or more third strobe signals;
    one or more flip-flops configured to latch an output of said third flip-flop based on said local clock signal and an inverse of said local clock signal;
    a multiplexer configured to select between outputs of said one or more flip-flops; and a third flip-flop coupled to said multiplexer and configured to present said data to said second circuit based on said local clock signal.

7. The apparatus according to claim 1, wherein said first circuit is configured to present said data when said apparatus is in a read mode.

8. The apparatus according to claim 1, wherein said predetermined cycle delay is one-quarter cycle time.

9. The apparatus according to claim 1, wherein said second circuit further comprises:
a synchronization detection circuit configured to present one or more first multiplexed signals to said memory controller, wherein said memory controller generates a second multiplexed signal which is used by the first circuit to determine when to push out data or pull in data from said memory.

10. An apparatus comprising:
means for presenting a first strobe signal having an unknown phase in relation to a local clock signal when receiving data from a memory;
means for synchronizing said first strobe signal with said local clock signal by (i) generating one or more second strobe signals and (ii) inserting a predetermined cycle delay between said one or more second strobe signal and said local clock signal; and
means for automatically calculate a round trip delay using a memory controller for (i) sending a sequence of data in a fixed pattern to the memory to read data, (ii) issuing a read command to said memory and (iii) determining the round trip delay by comparing the data read back against said data with said fixed pattern.

11. A method for synchronizing data in a memory, comprising the steps of:
(A) presenting a first strobe signal having an unknown phase in relation to a local clock signal when receiving data from said memory;
(B) synchronizing said first strobe signal with the local clock signal by (i) generating one or more second strobe signals and (ii) inserting a predetermined cycle delay between said one or more second strobe signal and said local clock signal; and
(C) automatically calculating a round trip delay with a memory controller by (i) sending a sequence of data in a fixed pattern to the memory, (ii) issuing a read command to said memory to read data and (iii) determining said round trip delay by comparing data that is read back against said data with said fixed pattern.

12. The method according to claim 11, wherein said predetermined cycle delay is the phase relationship between said one or more second strobe signals and said local clock signal.

13. The method according to claim 11, wherein step (A) further comprises the step of:
setting said first strobe signal equal to a voltage level of said memory.

14. The method according to claim 11, further comprising the step of:
generating said predetermined cycle delay with a delay locked loop circuit.

15. The method according to claim 11, further comprising the step of:
presenting said data in a read mode.

16. The method according to claim 11, further comprising the step of:
presenting one or more first multiplexed signals to said memory controller, wherein said memory controller generates a second multiplexed signal which is used to determine when to push out data or pull in data from said memory.

17. An apparatus comprising:
a first circuit configured to present a first strobe signal having an unknown phase in relation a local clock signal when receiving data from a memory, and
a second circuit configured to synchronize said first strobe signal with said local clock signal by (i) generating one or more second strobe signals and (ii) inserting a predetermined cycle delay between said one or more second strobe signals and said the local clock signal wherein (A) said first circuit comprises a data pad configured to present said data to said second circuit and (B) said data pad comprises (i) a first flip-flop configured to latch said data based on said one or more second strobe signals, (ii) a second flip-flop configured to latch an output of said first flip-flop based on a first inverse of said one or more second strobe signals, (iii) a third flip-flop configured to latch an output of said second flip-flop based on one or more third strobe signals, (iv) one or more flip-flops configured to latch an output of said third flip-flop based on said local clock signal and an inverse of said local clock signal, (v) a multiplexer configured to select between outputs of said one or more flip-flops, and (vi) a third flip-flop coupled to said multiplexer and configured to present said data to said second circuit based on said local clock signal.

* * * * *